United States Patent [19]

Tagusa et al.

[11] Patent Number: 4,963,002
[45] Date of Patent: Oct. 16, 1990

[54] CONNECTION CONSTRUCTION AND METHOD OF MANUFACTURING THE SAME

[75] Inventors: Yasunobu Tagusa, Kitakatsuragi; Hiroshi Matsubara, Tenri; Takashi Nukii, Nara, all of Japan

[73] Assignee: Sharp Kabushiki Kaisha, Osaka, Japan

[21] Appl. No.: 319,290

[22] Filed: Mar. 6, 1989

[30] Foreign Application Priority Data

Mar. 7, 1988 [JP] Japan .................. 63-54537

[51] Int. Cl.⁵ ............................. G02F 1/13
[52] U.S. Cl. ............................ 350/336; 350/343; 350/344
[58] Field of Search ................ 350/334, 343, 344, 336

[56] References Cited

U.S. PATENT DOCUMENTS

| 4,386,293 | 5/1983 | Waldron | 350/336 X |
| 4,640,581 | 2/1987 | Nakanowatari et al. | 350/336 X |
| 4,655,551 | 4/1987 | Washizuka et al. | 350/334 |
| 4,721,365 | 1/1988 | Nishimura | 350/336 |
| 4,832,455 | 5/1989 | Takeno et al. | 350/334 |

FOREIGN PATENT DOCUMENTS

| 0070529 | 6/1981 | Japan | 350/336 |
| 57-95640 | 6/1982 | Japan . | |
| 57-106057 | 7/1982 | Japan . | |
| 58-38768 | 8/1983 | Japan . | |
| 58-38769 | 8/1983 | Japan . | |
| 60-238817 | 11/1985 | Japan . | |

OTHER PUBLICATIONS

Nikkei Microdevices, Jun. 1987, p. 69.

Primary Examiner—Stanley D. Miller
Assistant Examiner—Huy K. Mai

[57] ABSTRACT

A connection construction is provided for connecting a first conductor provided on a first member such as a semiconductor driving device to a second conductor provided on a second member such as a liquid crystal display device driven by the semiconductor driving device, the connection construction including a conductive adhesive deposited on the first conductor, a conductive particle bonded with the conductive adhesive and partly protruding toward the second conductor disposed opposite thereto, and an electrically insulating adhesive for bonding the first member to the second member with the conductive particle contacting the second conductor. The first conductor and the second conductor are electrically connected via the conductive particle, and the first member and the second member are mechanically connected with the electrically insulating adhesive. Thus, a semiconductor driving device (LSI) is, for example, directly connected to a transparent substrate of a liquid crystal display device. Also, when an electrically insulating adhesive is used for bonding the conductive particle, the conductive particle is bonded to contact the first conductor.

10 Claims, 7 Drawing Sheets

CONNECTION CONSTRUCTION AND METHOD OF MANUFACTURING THE SAME

BACKGROUND OF THE INVENTION

1. Field of the Invention

The present invention relates to a connection construction which may be advantageously employed for connecting a substrate such as a semiconductor chip to a substrate or the like of a display panel used in various types of display devices, and to a method of manufacturing such connection construction.

2. Description of the Prior Art

In recent years, reduction in the weight and size of products has been actively worked on in electronic appliances in general. For example, by employing a liquid crystal display panel generally known as a flat display for products such as a portable television set, a word processor, and a car display device, it is possible to make these products smaller and thinner. In such applications, the connection of the substrate of a display device to a semiconductor chip or the like that drives the display device determines the overall dimensions of the product concerned and therefore has an extremely important meaning for encouraging the development of lighter, thinner and smaller products.

The prior art intended for helping to make lighter, thinner and smaller products includes a connection construction using a conductive adhesive, such as disclosed in Japan patent publication No. of unexamined application JP(A) 60-238817, and Japan patent publication No. of examined application JP(B) 58-38768 and JP(B) 58-38769.

Figure 1:
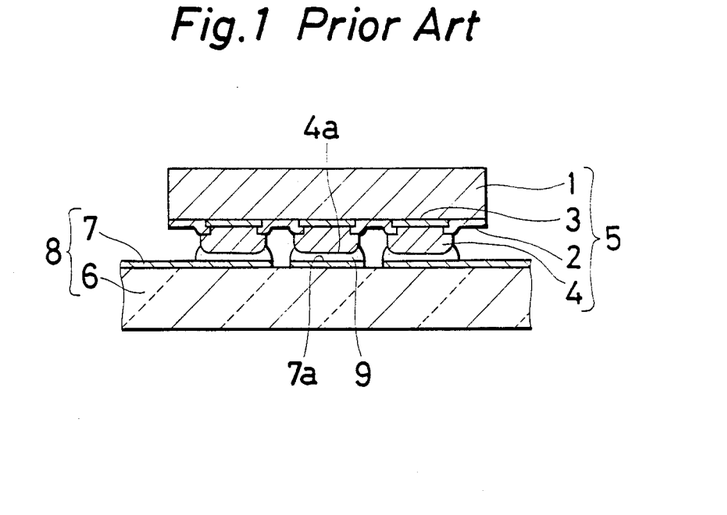
FIGS. 1-6 are cross sectional views of the prior art connection constructions.

FIG. 1 is a cross sectional view showing the connection construction of such prior art. As shown, a protective layer 2 and a wiring layer 3 are disposed on one surface of an electronic component body 1 formed for example of silicone, the wiring layer 3 being formed of aluminum, aluminum-silicone or other material and provided with electrodes 4 formed of gold, gold plated copper or other material, all of which combine to construct an electronic component 5. The electrodes 4 have a thickness of, for example, 20 to 60 μm, and the electronic component 5 is, for example, a semiconductor device such as a large scale integrated circuit (LSI).

A wiring layer 7 is disposed on one surface of the other body 6 formed of transparent glass or other material, to construct a substrate 8 of a liquid crystal display panel or the like. The wiring layer 7 is formed of metal oxide transparent conductive film (for example Indium Tin Oxide (ITO)) whose thickness is, for example, 1,000 to 2,000Å. The electronic component 5 and the substrate 8 are electrically connected via a conductive adhesive 9 interposed between a surface 4a of the electrode 4 and a surface 7a of the wiring layer 7. The conductive adhesive 9 is made, for example, of silver type paste.

This above prior art requires the provision of the protruding electrodes 4 on the wiring layer 3 by means of photolithography, plating or other process, and is therefore not economical, the material and production costs being high. Another difficulty with this prior art construction is the inability to obtain a stable connecting condition because of irregularities in the height of the electrodes 4, thereby causing contact failure in some cases.

Figure 2:
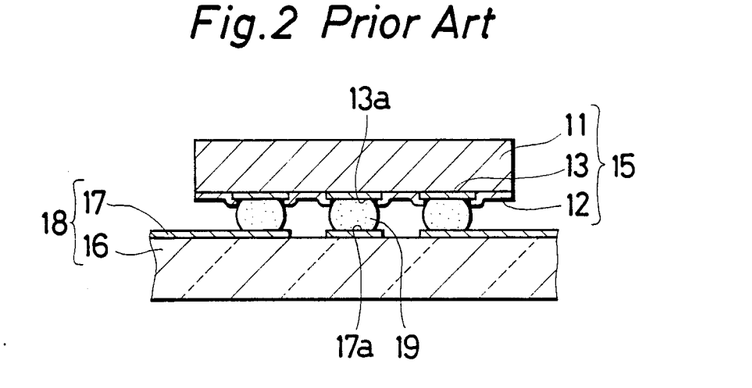

FIG. 2 is a cross sectional view of a connection construction in another prior art. In this connection construction, a wiring layer 13 and a protective layer 12 are disposed on a body 11, and an electronic component 15 which is not provided with electrodes such as mentioned above is connected to a substrate 18 comprising a body 16 formed of transparent glass or other material and a wiring layer 17 disposed thereon, via a conductive adhesive 19 interposed between surfaces 13a and 17a of the respective wiring layers 13 and 17.

Figure 3:
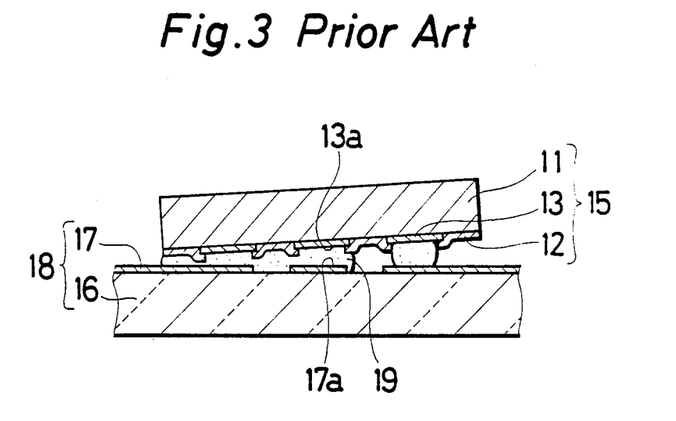

In this prior art construction, since the conductive adhesive 19 is soft paste-like form, a slight imbalance in the application of pressure when connecting the electronic component 15 and the substrate 18 causes the paste-like conductive adhesive 19 to excessively expand as shown in FIG. 3. This could cause an undesired connection of the adjacent wiring means on the wiring layers 13 and 17, damaging the electronic component 15 or the substrate 18 because of short circuit.

Figure 4:
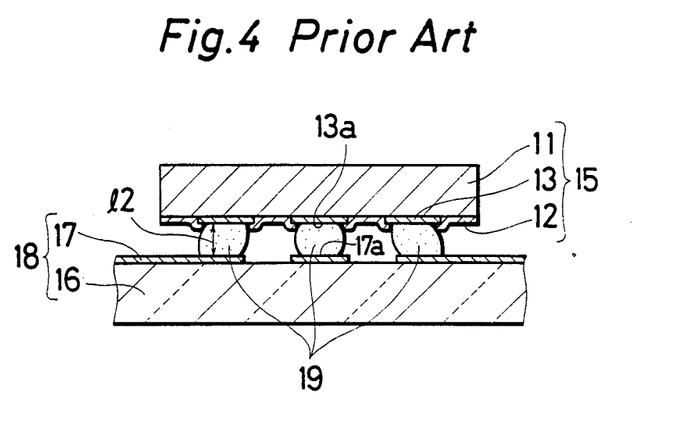

Furthermore, the difference in the thermal expansion coefficient between the electronic component 15 and the substrate 18 causes shearing strain on the connections when the temperature rises or lowers, and shearing stress is generated as a result. If the shearing stress is great enough, the conductive adhesive 19 may be separated or fractured. FIG. 4 shows an example of the deformation caused when the electronic component 15 having a smaller thermal expansion coefficient than the substrate 18 is subjected to a high temperature. It is well known that in such a case, the shearing strain becomes greater as the height 2 of the conductive adhesive 19 is shorter. On the other hand, the paste-like conductive adhesive 19 tends to be crushed more excessively as the height 2 is greater. Therefore, in this connection construction, connection with high reliability cannot be maintained over a long period of time.

Figure 5:
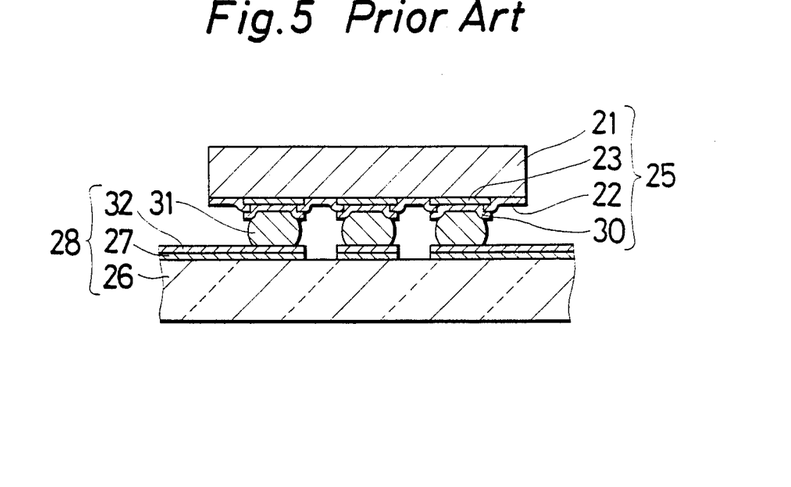

FIG. 5 is a cross sectional view of a connecting construction in still further prior art using solder, as disclosed in JP(A) 57-95640 and JP(A) 57-106057 and others. On the surface of a wiring layer 23 disposed on one surface of an electronic component body 21, is disposed a multilayer metal film 30 formed of metals such as copper, nickel, chrome, titan or their alloys. Also, a protective layer 22 is disposed on the surface of the body 21 where the wiring layer 23 is not deposited. The body 21, the wiring layer 23, the protective layer 22 and the multi-layer metal film 30 combine to construct an electronic component 25.

A substrate 28 comprises a body 26 formed of transparent glass or other material and a wiring layer 27 disposed on one surface thereof, the wiring layer 27 being provided with a film layer formed of nickel or other metal material thereon for improved wettability for solder 31. The thus constructed substrate 28 is electrically and mechanically connected to the electronic component 25 via the solder 31.

The above prior art requires the provision of the film layer 32 and the multi-layer metal film 30 for improved wettability for the solder 31, and is therefore uneconomical, the material and manufacturing costs being high. Also, this prior art requires heating for melting the solder 31 at higher temperatures than when using a conductive adhesive. In order to protect the electronic component 25 and the substrate 28 from the heat of the heated solder 31, the connecting work is time consuming because of the requirement of elaborate procedure considering heat dissipation, etc. Accordingly, the connection construction shown in FIG. 5 presents the difficulty in terms of workability and productivity.

Figure 6:
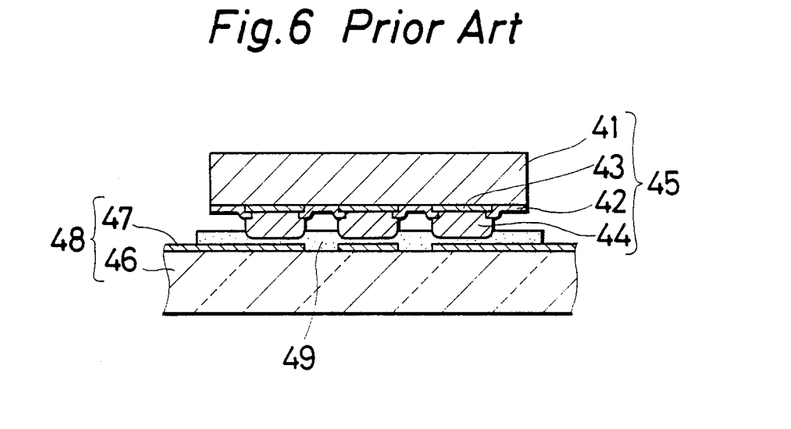

FIG. 6 is a cross sectional view of a connection construction in still another prior art using an anisotoropic conductive adhesive, as published on page 69 of the June 1987 issue of NIKKEI MICRODEVICES. The foregoing prior art described with reference to FIGS. 1 and 3 provided a construction in which the electronic component 5, 15 is connected with the substrate 8, 18 by using conductive adhesive 9, 19. On the other hand, the prior art hereinafter described uses an aeolotropic conductive adhesive 49 instead of a conductive adhesive 9, 19.

To illustrate diagrammatically, this prior art provides a construction wherein a protective layer 42 and a wiring layer 43 are disposed on a body 41, the wiring layer 43 being provided with electrodes 44 disposed thereon, all of which combining to construct an electronic component 45, while a wiring layer 47 is disposed on a body 46, constructing a substrate 48, the electronic component 45 and the substrate 48 being connected with each other via the aeolotropic conductive adhesive 49. In this construction, the aeolotropic conductive adhesive 49 becomes conductive at the point pressed by the protruding electrode 44, thereby electrically connecting the electrode 44 to the wiring layer 47 at the position corresponding therewith via the aeolotropic conductive adhesive 49.

As in the case with the prior art shown in FIG. 1, the above prior art also requires the provision of the protruding electrodes 44, and has the problem of high material and manufacturing costs.

SUMMARY OF THE INVENTION

Accordingly, it is an object of the invention to overcome the aforementioned technical difficulties and provide a connection construction and a method of manufacturing such connection construction wherein: the manufacturing process is simplified; material and manufacturing costs are reduced; production of lighter, thinner and smaller products is encouraged; and connection with high reliability is assured.

To attain the above object, the invention provides
a connection construction for connecting a first conductor provided on a first member to a second conductor provided on a second member and disposed opposite to the first conductor, comprising:
  a conductive adhesive deposited on the first conductor;
  a conductive particle bonded with the conductive adhesive and partly protruding toward the second conductor disposed opposite thereto; and
  an electrically insulating adhesive for bonding the first member to the second member with the conductive particle contacting the second conductor.

According to the invention, since the construction can be easily provided in a way that the contact portions of the conductive particles contacting the second conductor of the second member are positioned on a prescribed virtual plane, it is possible to connect the first member to the second member while keeping a prescribed spacing therebetween. Therefore, the construction of the invention is free from the problem such as described in connection with the prior art that the conductive adhesive is undesirably expanded to cause the adjacent conductors to short.

According to a preferred embodiment of the invention, either one of the first member or the second member is preferably a semiconductor driving device, and the other of the first member or the second member is a liquid crystal display device driven by the semiconductor driving device. Such construction eliminates the possibility of shorting the adjacent conductors, preventing the damage caused to the semiconductor driving device resulting from such shorting. Furthermore, as compared with the aforementioned prior art construction requiring the use of solder, the construction of the invention does not require the provision of a material wettable to solder, thus substantially reducing the material and manufacturing costs.

According to another preferred embodiment of the invention, the conductive adhesive is preferably formed of silver type paste. Further, as an electrically insulating adhesive, either one of, for example, an anaerobic adhesive, a thermosetting adhesive or a photohardening adhesive is preferably used.

And the invention provides
a method of manufacturing a connection construction for connecting a first conductor provided on a first member to a second conductor provided on a second conductor and disposed opposite to the first conductor, comprising the steps of:
  depositing the conductive adhesive on the first conductor of the first member;
  hardening the conductive adhesive after bonding a conductive particle to the conductive adhesive with a portion thereof exposed;
  interposing the electrically insulating adhesive between the first member and the second member; and
  pressing the first member and the second member toward each other while the electrically insulating adhesive retains its adhesive strength, and hardening the electrically insulating adhesive with the conductive particle contacting the second conductor.

It is a further feature of the invention to provide
connection construction for connecting a first conductor provided on a first member to a second conductor provided on a second member and disposed opposite to the first conductor, comprising:
  an electrically insulating first adhesive deposited at least on the first conductor;
  a conductive particle bonded with the first adhesive to contact the first conductor and partly protruding toward the second conductor; and
  an electrically insulating second adhesive for bonding the first member to the second member with the conductive particles contacting the second conductor.

According to a preferred embodiment of the invention, either one of the first member or the second member is a semiconductor driving device, and the other one of the first member or the second member is a liquid crystal display device driven by the semiconductor driving device. Also, the first adhesive and the second adhesive are of the same type or of different types of adhesives to be chosen from an anaerobic adhesive, a thermosetting adhesive or a photohardening adhesive.

Such connection construction is manufactured by a method including, for example,
  depositing an electrically insulating first adhesive at least on the first conductor of the first member;
  hardening the first adhesive after bonding a conductive particle to the first adhesive with the conductive particle contacting the first conductor and a portion of the conductive particle being exposed;

interposing an electrically insulating second adhesive between the first member and the second member; and pressing the first member and the second member toward each other while the second adhesive retains its adhesive strength, and hardening the second adhesive with the conductive particle contacting the second conductor.

In the step of hardening the first adhesive preferably comprises:

preparing a flat plate provided a recess having a depth A slightly larger than a spacing il between the first member and the second member;

disposing a plurality of conductive particles on the flat plate;

moving a flattening tool the flat plate to arrange the conductive particles in and bonding the conductive the first member coated with the first adhesive press the first member to the arranged conductive particles.

According to a preferred of the invention, the step of hardening the adhesive comprises:

a process of pressing the member coated with the first adhesive onto the conductive particles arranged on the flat surface to bond the particles to the first member; and removing excess conduct by applying vibration or blowing air over the first member with the first adhesive deposited surface down.

According to a further embodiment of the invention, a method of manufacturing connecting construction for connecting a first conductor on a first member to a second conductor provided on a member and disposed opposite to the first conductor, comprising the steps of:

depositing an electrically insulating and photohardening first adhesive the first member having the first conductor;

irradiating light onto the first adhesive in the regions that are not on the fi conductor, and hardening the first adhesive on those regions;

hardening the first adhesive in the remaining regions after bonding a conductive particle to the remaining regions of the first adhesive with the conductive particle contacting the first conductor and a portion of the conductive particle being exposed;

interposing an electrically insulating second adhesive between the first member and the second member; and pressing the first member and the second member toward each other while the second adhesive retains its adhesive strength, and hardening the second adhesive with the conductive particle contacting the second conductor.

According to another preferred embodiment of the invention, the second adhesive has a photohardening property, and at least the regions of the second member where the first member is bonded are formed of a light transmitting material, and in the step of hardening the second adhesive, light is irradiated through the second member onto the second adhesive. In such construction, the step of hardening the second adhesive is simplified.

Preferably the conductive particle formed of polymer material, of which almost all surface is coated with conductive film, is used.

Thus, in accordance with the invention, it is possible to provide reliable connections while keeping the spacing between the first member and the second member at a prescribed value and without increasing the material and manufacturing costs. Also, since a spacing of a prescribed value can be provided between the first member and the second member and, since the contact points of the conductive particles with the second conductor of the second member are slidable, it is possible to alleviate the shearing stress resulting from the difference in the thermal expansion coefficient between the first member and the second member, thus permitting the retention of highly reliable connection.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above-mentioned and other objects as well as the features and advantages of the invention will become more apparent with reference to the following detailed description and the accompanying drawings which are given by way of illustration only, and thus are not limitative of the present invention and wherein.

DETAILED DESCRIPTION OF THE PREFERRED EMBODIMENTS

With reference to the drawings, the preferred embodiments of the invention are hereinafter described in detail.

EXAMPLE 1

Figure 7:
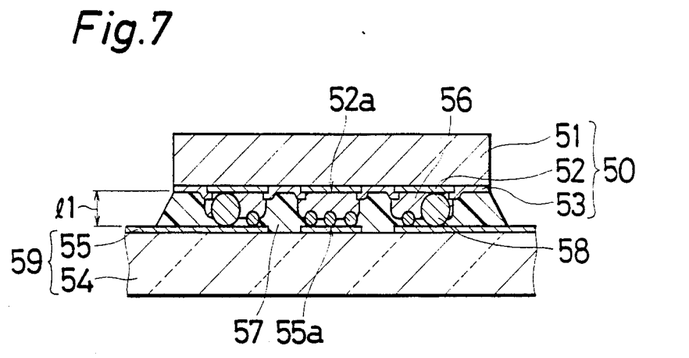
FIG. 7 is a cross sectional view of the connection construction of Example 1 according to the invention.

FIG. 7 shows a cross sectional view of one preferred embodiment of the invention. An electronic component 50 as a first member is, for example, a large scale integrated circuit (LSI), in which a diffused layer is formed on a wafer of silicon, gallium arsenide, etc., and contains numerous transistors, diodes, etc. and performs logic and other operations. This electronic component 50 usually has a display driving function when connected to a display panel such as a liquid crystal display device.

The electronic component 50 includes a body 51, an electrode 52 which is a first conductor formed on the uppermost layer of the body 51, and a protective layer 53 formed for example of SiN, PSG(glass), SiO$_2$ or polyimide. The electrode 52 is formed for example of aluminum-silicon, nickel, titan, tungsten, etc.

A second member, which consists of a substrate 59 of a liquid display panel or the like, includes a body 54 formed for example of soda glass, and a wiring layer 55 which is a second conductor formed on one surface of the body 54. The wiring layer 55 is formed for example of a metal oxide transparent conductive film (for example ITO) or a nickel plated ITO, and normally has a thickness of 1,000 to 2,000Å.

The electronic component 50 and the substrate 59 are connected with each other via a first conductive adhesive layer 56 and a second adhesive layer 57 in a way that a spacing of a prescribed value is provided between a surface 52a of the electrode 52 and a surface 55a of the wiring layer 55. The first adhesive layer 56 is formed, for example, of a conductive adhesive such as silver type paste.

For the second adhesive layer 57, various types of electrically insulating adhesives may be used, such as an anaerobic adhesive, a thermosetting adhesive and a photohardening adhesive. When the body 54 of the substrate 59 is formed of a light transmitting material such as glass, it is desirable to use for the second adhesive layer 57 a photohardening adhesive capable of quick bonding.

Conductive particles 58 are interposed between the first adhesive layer 56 and the second adhesive layer 57. The conductive particles 58 are formed, for example, of nickel plated plastic beads measuring approximately 5 to 30 μm in diameter, or of silver particles of the maximum diameter of 60 μm, and one or more particles are bonded to one connection with the conductive first adhesive layer 56. Each conductive particle 58 has a part of it embedded in the first adhesive layer 56 and the remaining part contacting the second adhesive layer 57 with one end penetrating the second adhesive layer 57 and contacting the surface 55a of the wiring layer 55. The other end of each conductive particle 58 may directly contact the surface 52a of the electrode 52 or may be electrically connected to the electrode 52 via the conductive first adhesive layer 56.

The construction shown in FIG. 7 may be provided in such a way that the whole construction is molded with a protective plastic for improved moisture resistance or provided with a mechanical protection Also, when metal plated plastic beads are used as the conductive particles 58, irregularities in the height of the conductive particles 58 when they contact the wiring layer surface 55a can be absorbed by the elasticity of the plastic, thus always retaining good contact with the wiring layer surface 55a to assure stable connections.

Figure 8:
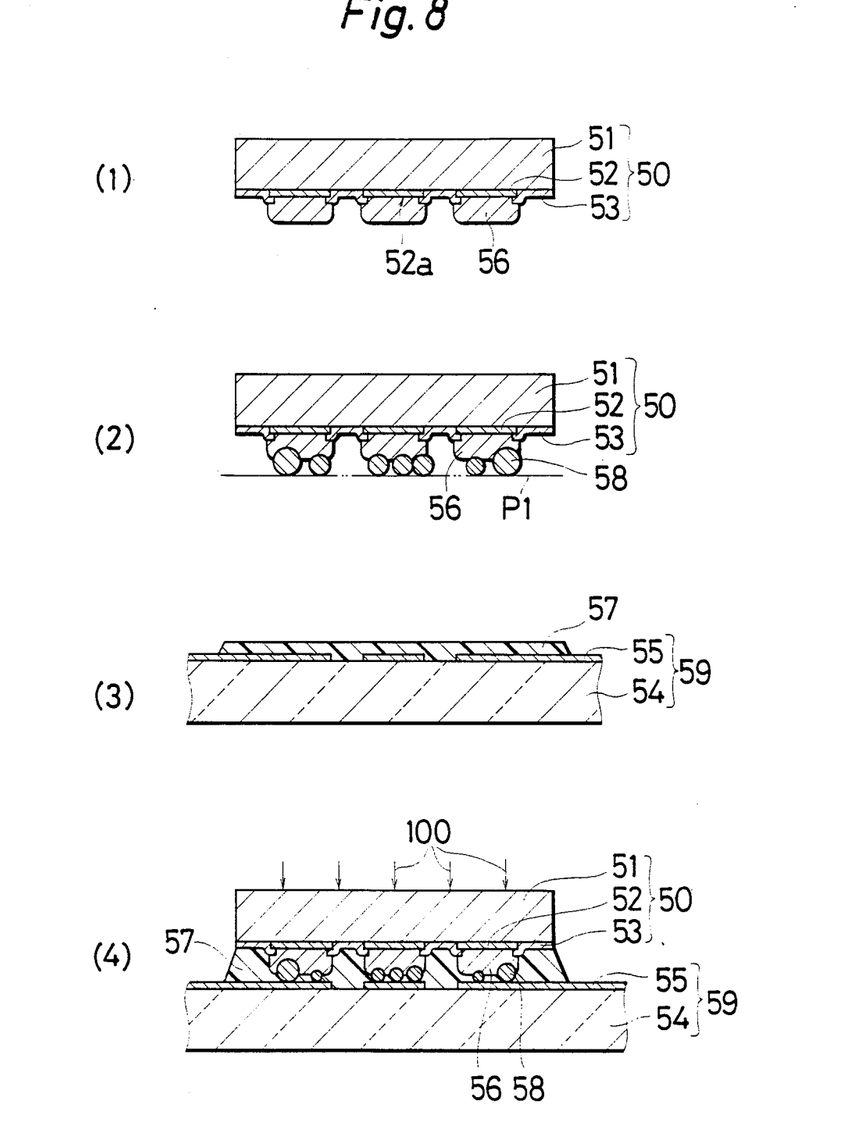
FIG. 8 is a cross sectional view explaining a manufacturing process of the connection construction of FIG. 7.

FIG. 8 is a diagram explaining a manufacturing process of the connection construction shown in FIG. 7. An example of the manufacturing process of this embodiment is hereinafter described with reference to FIG. 8. The electronic component 50 is already provided with a protective layer 53 and electrodes 52. Now, a conductive adhesive is applied on the surface 52a of each electrode 52 by printing or transfer method to form a first adhesive layer 56. FIG. 8(1) shows this state. At this time, the conductive adhesive is not applied on the protective layer 53.

Then, conductive particles 58 are bonded to the first adhesive layer 56 in a way that they are partly embedded in the first adhesive layer 56. As a method of bonding the conductive particles 58, the conductive particles 58 may be blown onto the first adhesive layer 56, or the method hereinafter described may be used. In any case, the conductive particles 58 are bonded to the first adhesive layer 56 with their lower ends when viewed in FIG. 8(2) are aligned on a virtual plane P1.

Next, the first adhesive layer 56 is hardened in the state shown in FIG. 8(2). At this time, by hardening the first adhesive layer 56 while lightly pressing a member having a flat surface against the surfaces of the conductive particles 58, it is possible to eliminate the irregularities in the height of the conductive particles 58 when they contact the wiring layer surface 55a.

On the other hand, as shown in FIG. 8(3), an electrically insulating adhesive is applied on the surface of the substrate 59, on which the wiring layer 55 was formed, by spin coating, spraying, brush coating, potting, screen printing or other method to form a second adhesive layer 57.

The electronic component 50, as shown in FIG. 8(2), having the conductive particles 58 disposed thereon and provided with the hardened first adhesive layer 56 is aligned with the substrate 59, as shown in FIG. 8(3), having the second adhesive layer 57 thereon, and both are pressed together to contact with each other by applying the pressure indicated by the arrows 100. FIG. 8(4) shows this state. In this state, the second adhesive layer 57 is hardened by irradiation of light, heat, etc., to form the connection construction shown in FIG. 7 Following this step, as previously mentioned, plastic molding may be provided to protect the whole construction as necessary.

The connection construction shown in FIG. 7 does not require photolithography,.plating or other process to form protruding electrodes, thus allowing the electronic component 50 to be directly connected to the substrate 59 with no increase in the material and manufacturing costs.

Figure 9:
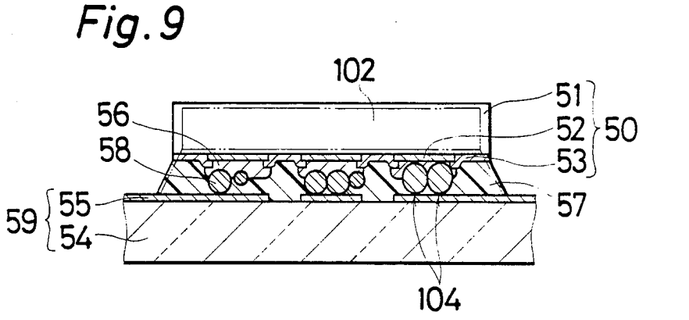
FIG. 9 is a cross sectional view explaining a state of deformation caused by temperature variation to the connection construction of FIG. 7.

Referring now to FIG. 9, when the connection construction of FIG. 7 is heated, positional slippage is caused between the corresponding electrode 52 and the wiring layer 55 because of the difference in the thermal expansion coefficient between the electronic component 50 and the substrate 59. In FIG. 9, the external shape under normal temperature is indicated by a virtual line 102.

In this embodiment, when such positional slippage is caused, the conductive particles 58 slide on their contact portions 104 while retaining the connection with the wiring layer 55, thereby preventing damage caused by temperature variation. The connection construction of this embodiment thus provides connections of high reliability, without an increase in the contact resistance when subjected to a temperature cycle test, for example.

Also, since the electrical connection is accomplished by the conductive particles 58 contacting the wiring layer 55, the construction of this embodiment does not require the interposition of such solderable metal layer as required in a construction using solder, and therefore a reduction in the material and manufacturing costs results. Furthermore, the second adhesive layer 57 filled between the electronic component 50 and the substrate 59 serves to protect the surfaces of the electronic component 50 and the substrate 59, thus providing a sealing effect without using an extra sealing plastic material or a mechanical protection.

EXAMPLE 2

Figure 10:
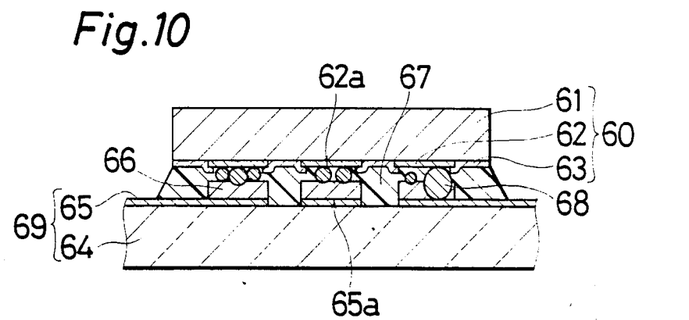
FIG. 10 is a cross sectional view of the connection construction of Example 2 according to the invention.

FIG. 10 is a cross sectional view of another preferred embodiment of the connection construction of the invention. As described above, a substrate 69 comprises a body 64 formed of glass or other material, and a wiring layer 65 disposed thereon. And an electronic component 60 includes a body 61, an electrode 62, and a protective layer 63. In this embodiment, a conductive first adhesive layer 66 is formed on the surface 65a of the wiring layer 65 in the region where the wiring layer 65 is formed. On the first adhesive layer 66, conductive particles 68 are fixed in the same manner as described above. At this time, one end of each conductive particle 68 may directly contact the surface 65a of the wiring layer 65 or may be electrically connected to the wiring layer 65 via the first adhesive layer 66.

On the other hand, an electrically insulating second adhesive layer 67 is formed on the electronic component 60. The second adhesive layer 67 is hardened while the thus constructed electronic component 60 is aligned and pressed together with the substrate 69. At this time, one end of each conductive particle 68 is made to contact the electrode surface 62a. Thus, the electronic component 60 and the substrate 69 are held together mechanically, and the electrode 62 of the electronic component 60 is electrically connected to the wiring layer 65 of the substrate 69 corresponding with the electrode 62.

The connection construction shown in FIG. 10 provides the same advantages as those described for the connection construction shown in FIG. 7. In the embodiments shown in FIGS. 7 and 10, the construction is described in which the conductive particles 58, 68 are disposed on either the electronic component 50, 60 or the substrate 59, 69, thereby connecting the electronic component 50, 60 to the substrate 59, 69. On the other hand, however, the construction may also be provided in such a wa that the conductive particles 58, 68 are disposed on both of the electronic component 50, 60 and the substrate 59, 69.

EXAMPLE 3

Figure 11:
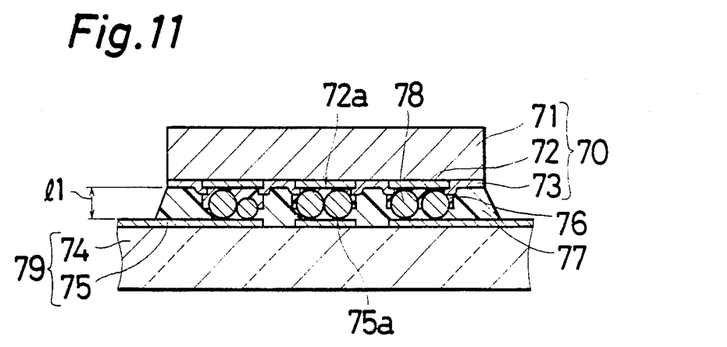
FIG. 11 is a cross sectional view of the connection construction of Example 3 according to the invention.
Figure 12:
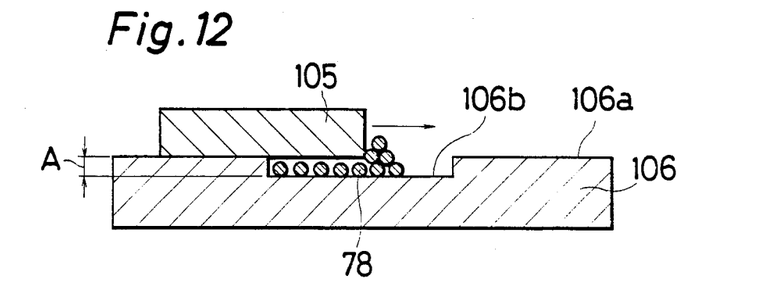
FIG. 12 is a cross sectional view explaining an example of disposition of conductive particles 78.

FIG. 11 is a cross sectional view of a still further embodiment of the connection construction of the invention. This embodiment uses an electrically insulating adhesive for the first adhesive layer 76 that corresponds to the adhesive layer 56 in the embodiment shown in FIG. 7. So an electronic component 70 includes a body 71, an electrode 72, and a protective layer 73 and a substrate 79 comprises a body 74 and a wiring layer 75. When the first electrically insulating adhesive 76 is employed, one end of each conductive particle 78 must be in contact with the surface 72a of the electrode 72, and the other end with the surface 75a of the wiring layer 75. In this case, the spacing (1 between the electrode surface 72a and the wiring layer surface 75a is slightly smaller than the normal state diameter of the conductive particle 78. In other words, the untensioned diameter of the largest of the conductive particles is less than the spacing 1. Thus particles 78 are elastically depressed. To arrange the conductive particles 78, a flat plate 106 is used, as shown in FIG. 12, for example, having a recessed portion whose depth A is slightly bigger than the diameter of the conductive particle 78.

The upper surface 106a of the flat plate 106 outside the recessed portion and the bottom surface 106b of the recessed portion are parallel to each other, and a prescribed quantity of conductive particles 78 are deposited in the recessed portion. To arrange the conductive particles 78 thus deposited, a flattening tool 105 is moved in one direction, or other method may be employed. Alternatively, a prescribed quantity of conductive particles 78 may be deposited on a flat plate 107 as shown in FIG. 13, and then, vibration is applied to the flat plate 107 to arrange the conductive particles 78.

Figure 13:
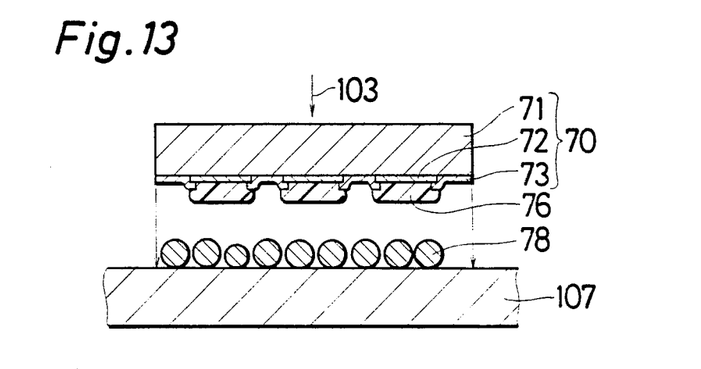
FIG. 13 is a cross sectional view explaining a method of bonding the conductive particles 78.

The electronic component 70 coated with the first adhesive layer 76 is then pressed from above in FIG. 13 on to the conductive particles 78 thus arranged on the flat plate 107 or the like, thereby making the conductive particles 78 adhere to the first adhesive layer 76.

If, because of electrostatic effect, etc., conductive particles 78 adhere to the regions where the first adhesive layer 76 is not formed, the excess conductive particles 78 may be removed by applying vibration to the electronic component 70 with the first adhesive layer 76 side facing down, by blowing with nitrogen gas, etc., by washing with liquid, or by other method. The removal of the excess conductive particles 78 may be carried out after the first adhesive layer 76 has been hardened. The above-mentioned method of disposing the conductive particles 78 may be employed in all the preferred embodiments Example 1-5.

EXAMPLE 4

Figure 14:
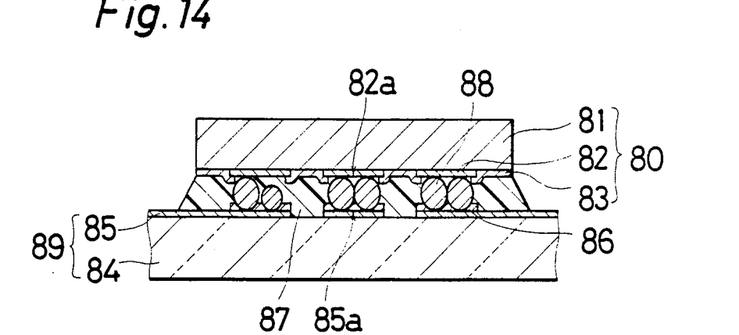
FIG. 14 is a cross sectional view of the connection construction of Example 4 according to the invention.

FIG. 14 is a cross sectional view of still another embodiment of the connection construction of the invention. The connection construction shown in FIG. 14 employs an electrically insulating adhesive to form the first adhesive layer 86 instead of the conductive first adhesive layer 66 in the connection construction shown in FIG. 10. So an electronic component 80 includes a body 81, an electrode 82 and a protective layer 83, and a substrate 89 comprises a body 84 and a wiring layer 85. In the connection construction of FIG. 14, the first adhesive layer 86 is formed on the surface 85a of the wiring layer 85 of the substrate 89. Also, the electrically insulating second adhesive layer 87 is formed on the surface of the electronic component 80 on which the electrodes 82 are formed. In this construction as well, one end of each conductive particle 88 must be in contact with the surface 82a of the electrode 82, and the other end with the surface 85a of the wiring layer 85 of the substrate 89.

In the connection constructions shown in FIGS. 11 and 14, the electrically insulating first adhesive layer 76, 86 and the electrically insulating second adhesive layer 77, 87 may be formed for example of the same material. Also, the first adhesive layer 76, 86 may be formed of pressure sensitive adhesive.

EXAMPLE 5

Figure 15:
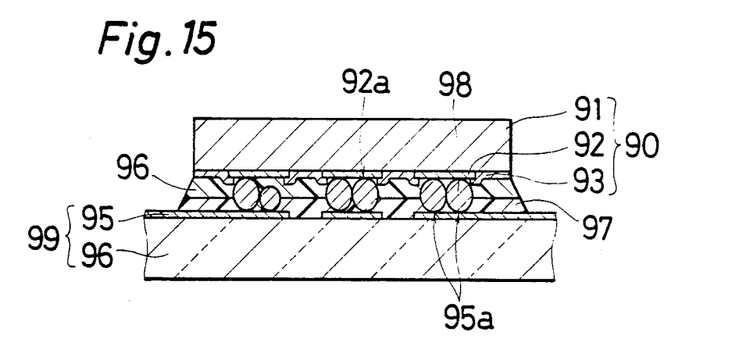
FIG. 15 is a cross sectional view of the connection construction of Example 5 according to the invention.
Figure 16:
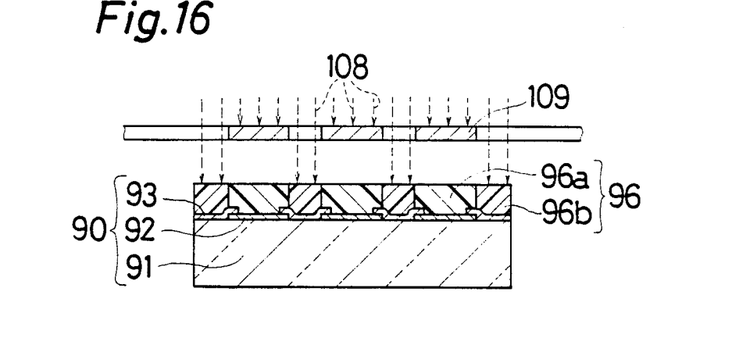
FIG. 16 is a cross sectional view explaining a manufacturing process of the connection construction shown in FIG. 15.

FIG. 15 is a cross sectional view of yet another embodiment of the connection construction of the invention. In this embodiment also, an electronic component 90 includes a body 91, an electrode 92 and a protective layer 93, and a substrate 99 comprises a body 94 and wiring layer 95. In making the connection construction shown in FIG. 15, an electrically insulating photohardening first adhesive layer 96 is formed, as shown in FIG. 16, on all of the surface of the electronic component 90 on which surface electrodes 92 were formed. On the adhesive layer 96, light is irradiated as indicated by the arrows 108 through a mask 109, thereby hardening the adhesive layer 96b in the regions where a protective layer 93 is provided. Then, the conductive particles 98 are disposed in the same manner as previously described, and the electronic component 90 and the substrate 99 coated with the second adhesive layer 97 are pressed together. In this condition, the adhesive layers being hardened, and the electronic component 90 and the substrate 99 are connected with each other. Thus, the connection construction shown in FIG. 15 is provided.

In this connection construction as well, one end of each conductive particle 98 is in contact with the surface 92a of the electrode 92 of the electronic component 90, and the other end of each conductive particle 98 with the surface 95a of the wiring layer 95 of the substrate 99. Therefore, the electrode 92 and the wiring layer 95 are electrically connected via the conductive particle 98. Also, the electronic component 90 and the substrate 99 are mechanically held together by the first adhesive layer 96 and the second adhesive layer 97 interposed therebetween.

In the above embodiments 1 through 5, the ends of conductive particles that contact the electrode surfaces or the wiring layer surfaces can be easily formed to accurately align on a virtual plane, as compared with the electrodes formed by photolithography, plating or other method mentioned in connection with the prior art. Therefore, a stable connecting condition can be provided at each connection. Also, as seen in these embodiments, since protrusions which constitute part of conductive particles are provided on either the electronic component or the substrate, and the first adhesive layer is then hardened, the prescribed spacing 1 can be equally maintained, and material costs can be reduced.

In the above embodiments, the second adhesive layer may be selectively disposed in the desired regions on the surface of either the electronic component or the substrate. In this case, it is not compulsory to dispose the second adhesive layer corresponding with the positions of the conductive particles.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A connection construction for connecting a first conductor provided on a first member to a second conductor provided on a second member and disposed opposite to the first conductor, comprising:
    a first electrically insulating adhesive deposited at least on the first conductor;
    at least one conductive plastic bead bonded with the first adhesive to contact the first conductor and partly protruding toward the second conductor, each conductive bead having a plated nickel surface; and
    a second electrically insulating adhesive for bonding the first member to the second member with the at least one conductive bead contacting the second conductor, spacing between the first and second conductors being less than a normal state, untensioned diameter of a largest one of the conductive beads whereby the at least one conductive bead is elastically depressed.

2. The connection construction claimed in claim 1, wherein the first conductive adhesive is a silver type paste.

3. The connection construction claimed in claim 1 wherein
    either one of the first member or the second member is a semiconductor driving device, and the other one of the first member or the second member is a liquid crystal display device driven by the semiconductor driving device.

4. The connection construction claimed in claims 1 or 3 wherein
    the first adhesive and the second adhesive are of the same type or of different types of adhesives to be chosen from an anaerobic adhesive, a thermosetting adhesive or a photohardening adhesive.

5. A method of manufacturing a connection construction for connecting a first conductor provided on a first member to a second conductor provided on a second member and disposed opposite to the first conductor, comprising the steps of:
    depositing a first electrically insulating adhesive at least on the first conductor of the first member;
    bonding at least one conductive particle to the first adhesive, the at least one conductive particle contacting the first conductor and a portion of the at least one conductive particle being exposed, an outermost exposed portion of each conductive particle lying generally in a plane;
    hardening the first adhesive after the at least one conductive particle is bonded thereto;
    interposing a second electrically insulating adhesive between the first member and the second member; and
    pressing the first member and the second member toward each other while the second adhesive retains its adhesive strength, and hardening the second adhesive with the conductive particle contacting the second conductor.

6. The method of manufacturing a connection construction claimed in claim 5, wherein the steps of bonding and of hardening the first adhesive further comprises the steps of:
    preparing a flat plate having a recess defined therein, the recess having a depth which is slightly larger than a diameter of the conductive particle;
    disposing a plurality of conductive particles on the flat plate;
    moving a flattening tool over the flat plate to arrange the conductive particles in the recess; and
    bonding the conductive particles to the first member coated with the first adhesive by pressing the first member to the conductive particles.

7. The method of manufacturing a connection construction as set forth in claims 5 or 6 wherein the steps of bonding and hardening the first adhesive further comprises the steps of:
    pressing the first member coated with the first adhesive onto the conductive particles arranged on a flat surface to bond the conductive particles to the first member thereby placing the outermost exposed portion of each particle in generally the same plane when the particles are bonded to the first adhesive; and
    removing excess conductive particles by one of applying vibration and blowing air over the first member with the first adhesive deposited surface facing down.

8. A method of manufacturing a connection construction for connecting a first conductor provided on a first member to a second conductor provided on a second member and disposed opposite to the first conductor, comprising the steps of:

depositing a first electrically insulating and photohardening adhesive on a first member having the first conductor;

irradiating light onto the first adhesive in regions failing to have the first conductor, and hardening the first adhesive on those regions;

hardening the first adhesive in the remaining regions after bonding a conductive particle to the remaining regions of the first adhesive with a conductive particle contacting the first conductor and a portion of the conductive particle being exposed;

interposing a second electrically insulating adhesive between the first member and the second member; and pressing the first member and the second member toward each other while the second adhesive retains its adhesive strength, and hardening the second adhesive with the conductive particle contacting the second conductor.

9. A method of manufacturing a connection construction claimed in claim 8 wherein the second adhesive has a photohardening property, and at least the regions of the second member where the first member is bonded are formed of a light transmitting material, and in the step of hardening the second adhesive, light is irradiated through the second member into the second adhesive.

10. A connection construction comprising:

a first substrate and a second substrate having electrodes on the surfaces opposite each other;

a first adhesive layer which is made from one of a conductive material and a nonconductive material, the first adhesive layer being formed at least on the electrode of the first substrate;

a second electrically insulating adhesive layer interposed between the first adhesive side surface of the first substrate and the electrode side surface of the second substrate; and at least one conductive plastic bead which contacts the electrode of the second substrate and the electrode of the first substrate by one of a direct connection and a connection via the first adhesive layer, each conductive bead having a plated nickel surface, spacing between the electrodes on the first and second substrate being less than a normal state, untensioned diameter of a largest one of conductive beads whereby the bead is elastically depressed.

* * * * *